US005895976A

United States Patent [19]
Morrell et al.

[11] Patent Number: 5,895,976
[45] Date of Patent: Apr. 20, 1999

[54] MICROELECTRONIC ASSEMBLY INCLUDING POLYMERIC REINFORCEMENT ON AN INTEGRATED CIRCUIT DIE, AND METHOD FOR FORMING SAME

[75] Inventors: Michelle J. Morrell, Glen Ellyn, Ill.; Steven C. Machuga, Deisenhofen, Germany; Grace M. O'Malley, Hoffman Estates, Ill.; George A. Carson, Elk Grove Village, Ill.; Andrew Skipor, Glendale Heights, Ill.; Wen Xu Zhou, Atlanta, Ga.; Karl W. Wyatt, Cary, Ill.

[73] Assignee: Motorola Corporation, Schaumburg, Ill.

[21] Appl. No.: 08/657,216

[22] Filed: Jun. 3, 1996

[51] Int. Cl.⁶ .................................................. H01L 23/48
[52] U.S. Cl. .......................... 257/778; 257/704; 257/701; 438/108
[58] Field of Search .................................. 257/667, 778, 257/790, 701, 703, 704; 29/840, 841; 438/108, 118, 175

[56] References Cited

U.S. PATENT DOCUMENTS

| | | | |
|---|---|---|---|
| 4,843,036 | 6/1989 | Schmidt et al. | 29/841 |
| 4,942,140 | 7/1990 | Ootsuki et al. | 29/841 |
| 5,089,440 | 2/1992 | Christie et al. | 437/209 |
| 5,120,678 | 6/1992 | Moore et al. | 437/183 |
| 5,121,190 | 6/1992 | Hsiao et al. | 357/80 |
| 5,128,746 | 7/1992 | Pennisi et al. | 357/72 |
| 5,136,366 | 8/1992 | Worp et al. | 357/72 |
| 5,218,234 | 6/1993 | Thompson et al. | 257/787 |
| 5,218,759 | 6/1993 | Juskey et al. | 29/840 |
| 5,220,489 | 6/1993 | Barreto et al. | 361/400 |
| 5,241,133 | 8/1993 | Mullen, III et al. | 174/52.4 |
| 5,249,101 | 9/1993 | Frey et al. | 361/717 |
| 5,274,913 | 1/1994 | Grebe et al. | 29/840 |
| 5,278,726 | 1/1994 | Bernardoni et al. | 361/783 |
| 5,285,352 | 2/1994 | Pastore et al. | 361/707 |
| 5,290,197 | 3/1994 | Ohnuma et al. | 29/841 |
| 5,317,195 | 5/1994 | Ishikawa | 257/790 |
| 5,355,580 | 10/1994 | Tsukada | 29/840 |
| 5,423,119 | 6/1995 | Yang | 29/841 |
| 5,460,767 | 10/1995 | Sanftleben et al. | 29/841 |
| 5,471,027 | 11/1995 | Call et al. | 29/841 |
| 5,568,684 | 10/1996 | Wong | 29/841 |
| 5,583,370 | 12/1996 | Higgins, III et al. | 257/667 |
| 5,656,857 | 8/1997 | Kishita | 257/790 |
| 5,659,203 | 8/1997 | Call et al. | 257/778 |
| 5,684,325 | 11/1997 | Kataoka et al. | 257/790 |

FOREIGN PATENT DOCUMENTS

| | | | |
|---|---|---|---|
| 402165613 | 6/1990 | Japan | 29/841 |
| 406069369 | 3/1994 | Japan | 228/180.22 |

*Primary Examiner*—Olik Chaudhuri
*Assistant Examiner*—Nathan K. Kelley
*Attorney, Agent, or Firm*—Douglas D. Fekete; John MacIntyre

[57] ABSTRACT

A microelectronic assembly (10) includes an integrated circuit die (12) mounted onto a substrate (14) by solder bump interconnections (32). The die (12) and the substrate (14) are spaced apart by a gap (30) that is filled with a polymeric encapsulant (16). The die (12) includes a die perimeter (24) and a face (27) facing away from the substrate (14). A polymeric reinforcement (18) is disposed onto the die face (27) to protect the die (12) and to reduce the effects of thermally induced stresses on the die (12) and the solder bump interconnections (32). The polymeric reinforcement (18) is spaced apart from the die perimeter (24) to maintain a desired peripheral fillet geometry of the encapsulant (16).

19 Claims, 2 Drawing Sheets

1

MICROELECTRONIC ASSEMBLY INCLUDING POLYMERIC REINFORCEMENT ON AN INTEGRATED CIRCUIT DIE, AND METHOD FOR FORMING SAME

FIELD OF THE INVENTION

This invention relates generally to a microelectronic assembly in which an integrated circuit die is spaced apart from a substrate by a gap that is filled with an encapsulant. More particularly, this invention relates to such a microelectronic assembly that includes a polymeric reinforcement disposed on the integrated circuit die to protect the die from cracking and damage.

BACKGROUND OF THE INVENTION

It is known to form a microelectronic assembly by a direct chip attach method, commonly referred to as flip chip, wherein an integrated circuit die is mounted directly onto a substrate, such as a printed circuit board, by solder bump interconnections. The integrated circuit die is spaced apart from the printed circuit board by a gap, and the solder bump interconnections extend across the gap and connect bond pads on the integrated circuit die to bond pads on the printed circuit board. In this manner, the integrated circuit die is attached to the printed circuit board, and electrical signals are conducted to and from the die for processing.

Because of differences in the coefficients of thermal expansion of the die and the board, stresses are created when the assembly is subjected to thermal cycling of the type experienced during operation. These stresses tend to fatigue the solder bump interconnections and can lead to failure of the assembly. In order to strengthen the solder joints without affecting the electrical connection, the gap is filled with a polymeric encapsulant.

The encapsulant is typically applied after the die is attached by the solder bump interconnections to the printed circuit board. A curable mixture comprising inorganic particulate filler dispersed in a polymeric precursor is dispensed onto the printed circuit board adjacent to the die and is drawn into the gap by capillary action. The precursor is then cured, typically by heating, to form the encapsulant. The encapsulant strengthens the assembly and protects the solder bump interconnections from environmental damage.

The curing process, however, creates thermal stresses during the heating and cooling of the assembly. Stresses are also experienced during use of the microelectronic assembly. These stresses can be detrimental to the die and the solder bump interconnections and can cause a detrimental warping of the integrated circuit die. The stresses can also lead to cracking of the die, particularly on the side of the die opposite the solder bump interconnections, commonly referred to as the non-active face of the die.

Therefore, a need exists to reduce the detrimental effects of thermally induced stresses upon an integrated circuit die and solder bump interconnections of a microelectronic assembly. Further, a need exists to strengthen and improve the reliability of integrated circuit die that includes reducing cracks or other defects and to extend the useful life of a microelectronic assembly.

2

Figure 1:
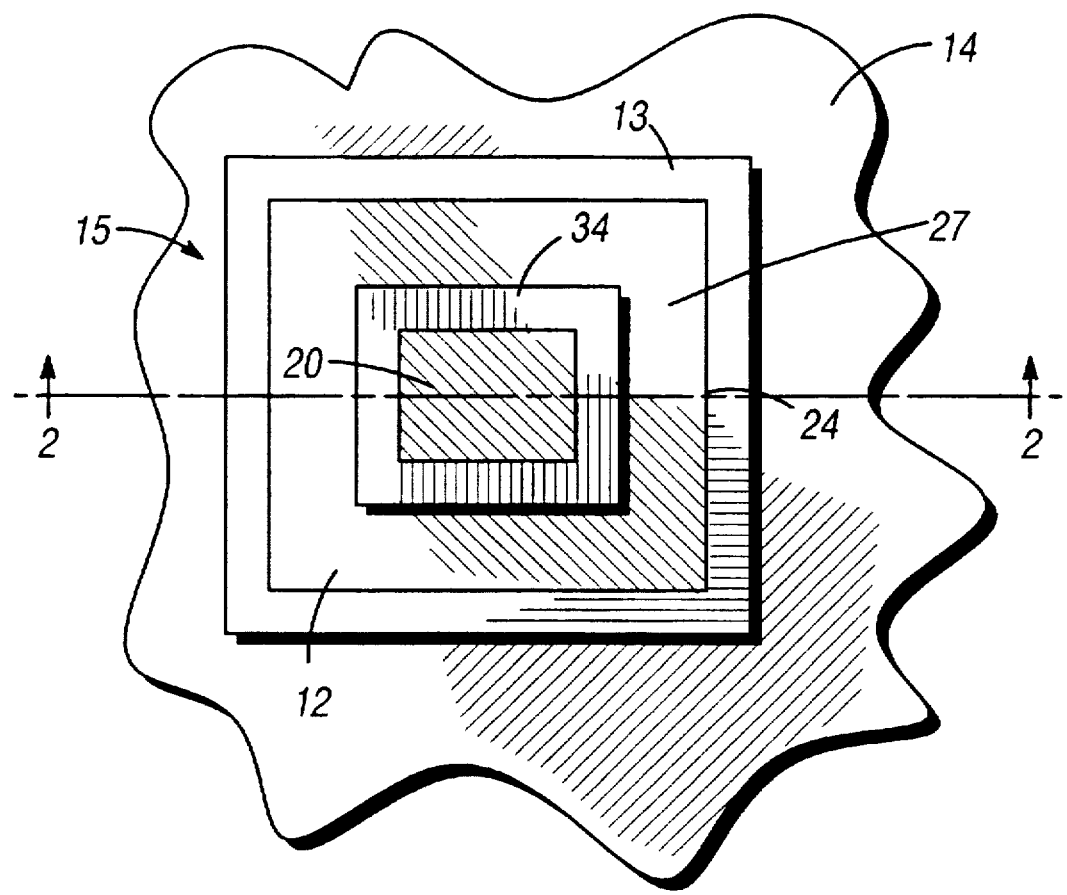
FIG. 1 is a top plan view of a preassembly showing a curable material dispensed in accordance with a preferred embodiment of the present invention.
Figure 2:
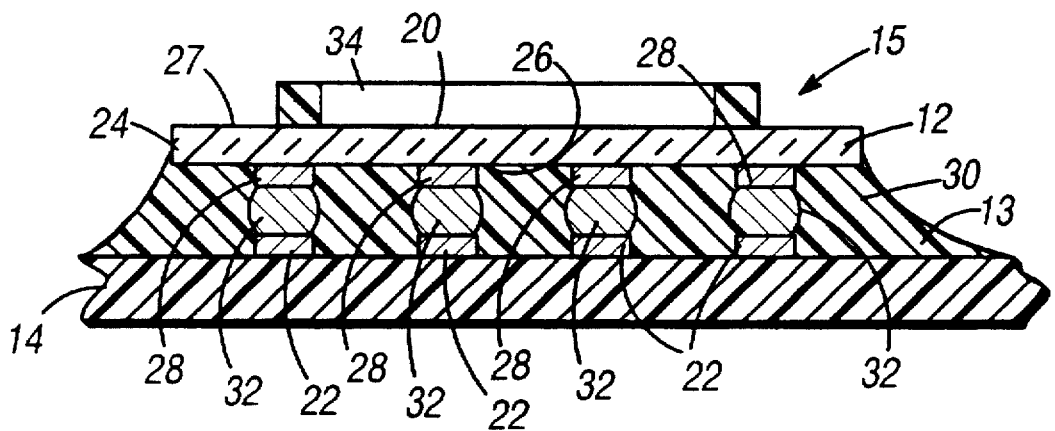
Figure 3:
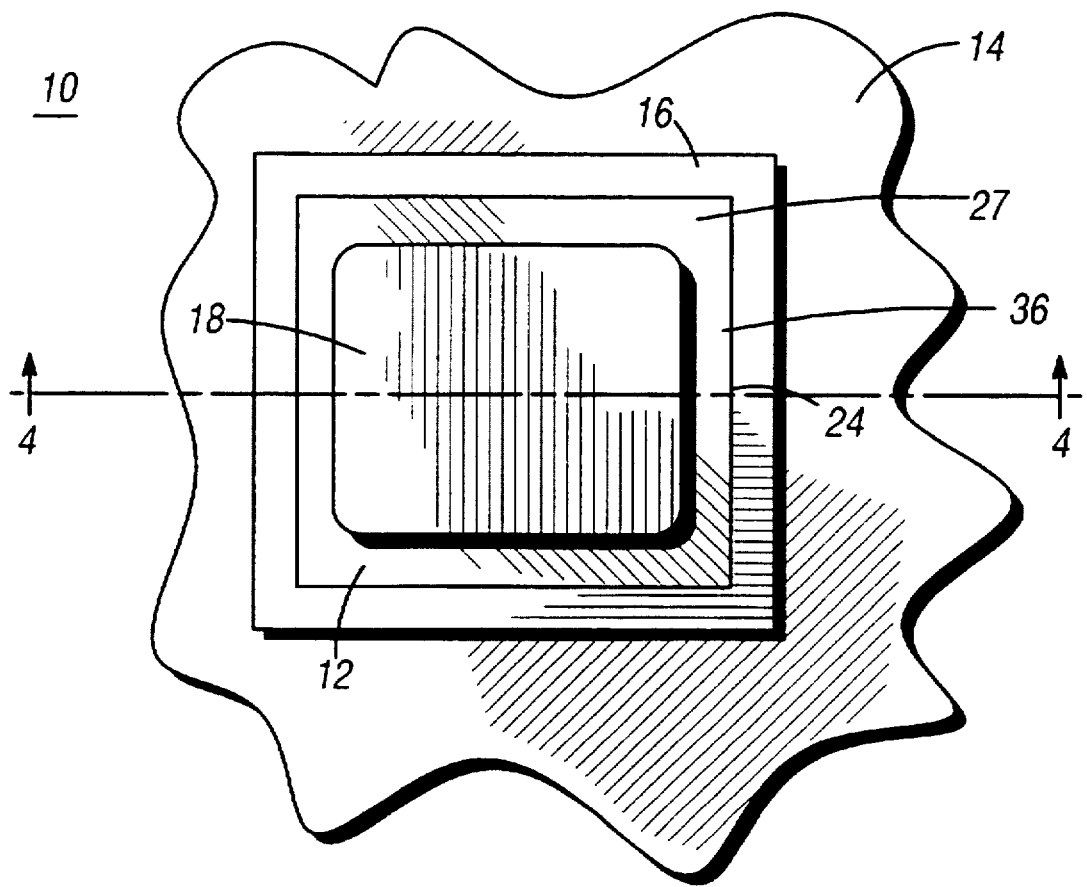
Figure 4:
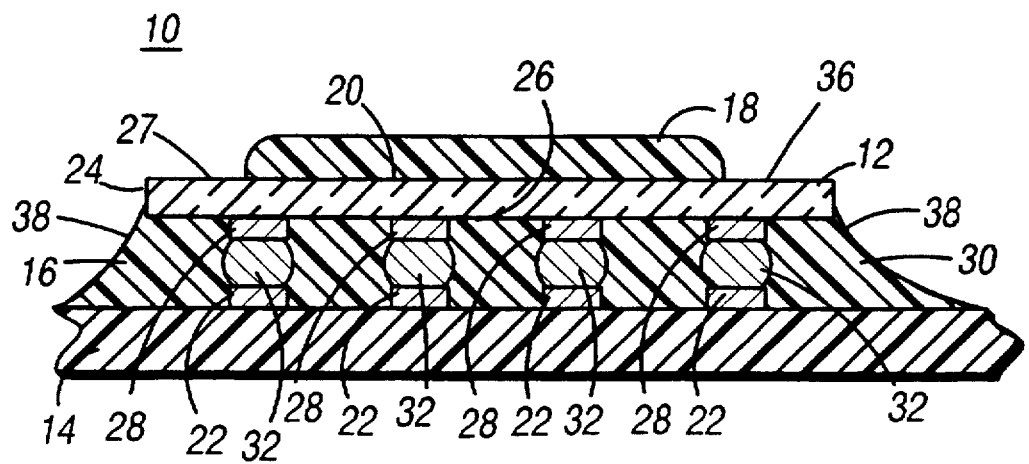

FIG. 2 is a cross-sectional view of the preassembly in FIG. 1 taken along line 2—2 in the direction of the arrows;

FIG. 3 is a top plan view of a microelectronic assembly produced from the preassembly in FIG. 1 and showing a polymeric reinforcement in accordance with a preferred embodiment of the present invention; and FIG. 4 is a cross-sectional view of the microelectronic assembly of FIG. 3 taken along line 4—4 in the direction of the arrows.

DETAILED DESCRIPTION OF A PREFERRED EMBODIMENT

The present invention provides a microelectronic assembly in which an integrated circuit die is spaced apart from a substrate, such as a printed circuit board, by a gap and attached to the substrate by solder bump interconnections that extend across the gap. The solder bump interconnections physically attach and electrically connect an electrical circuit on the substrate to an electrical circuit on the die for conducting electrical signals to and from the die for processing. An encapsulant is disposed within the gap to protect the solder bump interconnections. In accordance with this invention, a polymeric reinforcement disposed on the non-active face of the integrated circuit die spaced apart from the perimeter provides enhanced mechanical support and protection for the integrated circuit die.

A preferred embodiment of the present invention can be better understood with reference to FIGS. 1 through 4. In accordance with a preferred embodiment of this invention, a microelectronic assembly 10 in FIGS. 3 and 4 is formed from a preassembly 15 in FIGS. 1 and 2. Preassembly 15 comprises an integrated circuit die 12 mounted by a flip-chip process onto a substrate 14. Integrated circuit die 12 is preferably formed of silicon and comprises an active face 26 facing substrate 14 and a non-active face 27 opposite active face 26. Active face 26 and non-active face 27 are generally planar and parallel to substrate 14. Die 12 includes a die perimeter 24. Non-active face 27 includes a central region 20 that is spaced apart from die perimeter 24 by a border region 36.

By way of an example of a preferred embodiment, preassembly 15 includes a die 12 having die bond pads 28 disposed on active face 26 to facilitate electrical connection to circuits (not shown) on die 12. Die bond pads 28 are composed of a solder-wettable metal, and are preferably formed of aluminum pads coated with a layer of chromium, which is in turn coated with a layer of copper. Solder bumps are disposed on die bond pads 28 and are preferably formed of tin-lead solder comprising about 97 weight percent lead and the balance substantially tin and having a melting temperature of about 212° C.

Substrate 14 is preferably a printed circuit board, of the type referred to as an FR4 board, which is formed of a polymer layer laminated onto a ceramic or polymer/glass mesh core. Substrate bond pads 22 are disposed on substrate 14 and are preferably composed of solder-wettable copper that is coated with tin-lead solder having a composition near eutectic tin-lead alloy, formed of about 63 weight percent tin and the balance substantially lead and having a melting temperature of about 183° C.

In accordance with a preferred embodiment of the present invention, integrated circuit die 12 is arranged to overlie substrate 14 such that each of the die bond pads 28 registers with a substrate bond pad 22. A flux is preferably applied to the solder bumps to enhance wetting during reflow. The arrangement is heated to a temperature, suitably between about 183° C. and about 220° C., sufficient to reflow the eutectic solder on bond pads 22 to wet the solder bumps on die bond pads 28. Thereafter, the arrangement is cooled to solidify the solder to form solder bump interconnections 32. Solder bump interconnections 32 extend across gap 30, which is formed between active face 26 and substrate 14. By way of an example, gap 30 is between about 25 and 150 microns. Solder bump interconnections 32 are effective in electrically and mechanically connecting die bond pads 28 to substrate bond pads 22.

In order to enhance the reliability of preassembly 15, it is desired to dispose an encapsulant within gap 30. To form the encapsulant, integrated circuit die 12 is underfilled with a first curable material 13. In accordance with a preferred embodiment of the present invention, curable material 13 is composed of a flowable mixture comprising fine inorganic particles dispersed in a polymeric precursor that is formulated to produce a resinous matrix, preferably an epoxy-base resin. A preferred epoxy-base formulation includes a hardener, a catalyst, an adhesion promoter, and inorganic particles added as a filler. The hardener is suitably an amine-terminated polyether compound, preferably triethyleneglycol diamine, that reacts with the epoxy precursor during curing. The ratio of the epoxy resin to the hardener is about 3:1. The catalyst, suitably 2-phenylimidazole, promotes reaction of the constituents during curing. The adhesion promoter is preferably aminosilane, and enhances wetting of substrate 14 to promote adhesion of the resultant encapsulant. The filler is formed of inorganic particles, such as silica or alumina particles. In a preferred embodiment, the filler is composed of fused silica particles of two sizes, a first having an average size of 6 microns and a second having an average size of 20 microns, the sizes being average agglomerate sizes as measured by conventional laser scattering techniques. Adding filler particles of different sizes enhances the flow properties of curable material 13 into gap 30. A preferred first curable material 13 is composed of about 20 to 30 weight percent epoxy prepolymer, about 3 to 10 weight percent hardener, about 0.1 to 1.0 weight percent catalyst, about 0.01 to 0.10 weight percent adhesion promoter, with the balance being substantially silica powder. The curable material formulation can be modified to produce a polymer with desired characteristics, such as a desired cure time, cure temperature, and thermal expansion properties. A suitable epoxy-base precursor material is commercially available from The Dexter Corporation under the trade designation Dexter Hysol FP4510.

In a preferred embodiment, first curable material 13 is dispensed onto substrate 14 adjacent to die perimeter 24. Precursor material 13 is preferably dispensed in a bead on two adjacent sides of integrated circuit die 12 using a syringe or the like. Prior to dispensing curable material 13, preassembly 15 is preheated to a temperature, preferably about 75° C., lower than the cure temperature of curable material 13, to lower the viscosity and enhance the flowability of curable material 13. Precursor 13 is then drawn into gap 30 by capillary action. Precursor 13 will form fillets within perimeter 24 of die 12 that extend onto substrate 14.

After first curable material 13 is dispensed onto substrate 14, and preferably prior to curing material 13, a second curable material 34 is dispensed onto central region 20 of non-active face 27 of die 12. Material 34 is preferably dispensed using a syringe or the like. Second curable material 34 is formed of a composition substantially similar to first curable material 13 so that the coefficients of thermal expansion of the resultant encapsulant and polymeric reinforcement are virtually identical. Moreover, the cure schedule of the two curable materials is the same, thereby eliminating excess steps necessary when curing multiple materials having differing cure schedules.

In a preferred embodiment, second curable material 34 is dispensed in a rectangular bead onto central region 20 of non-active face 27 and is spaced at least 50 mils from die perimeter 24. This spacing ensures that curable material 34 will remain within central region 20 during the flowing and curing of curable material 34. Alternately, curable material 34 can be dispensed in a glob onto integrated circuit die 12 or in any pattern that will produce the desired flow characteristics to form the desired shape for the resultant encapsulant. It is a significant feature of the present invention that curable material 34 is dispensed onto central region 20. By limiting curable material 34 to central region 20, a resulting polymeric reinforcement formed from curable material 34 will form a uniform entity overlying central region 20 on non-active face 27. This ensures that the fillets formed in the underfilling encapsulant will remain intact, which increases the reliability of the product assembly by maintaining the peripheral fillet geometry, which assist in distributing the stresses of the underfilling encapsulant.

Upon heating, the viscosity of curable material 34 decreases and curable material 34 flows over central region 20 to form a uniform entity. Different dispensing patterns can be used to form the curable material in a desired pattern. An advantage of dispensing a curable material onto non-active face 27 is that curable material 34 will, while in its liquidus form, fill any cracks or other defects that are present in non-active face 27. By filling these cracks, die 12 is protected to inhibit the growth of the cracks and to prevent other damage that might otherwise occur during thermal cycling.

After second curable material 34 is dispensed, preassembly 15 is heated to cure curable material 13 and curable material 34 to form encapsulant 16 and polymeric reinforcement 18, respectively, as shown in FIGS. 3 and 4. Precursors 13 and 34 are cured by heating to a temperature sufficient to cross-link the epoxy-base prepolymers. A suitable cure schedule for the preferred epoxy-base resin is between 30 and 120 minutes at a temperature between about 120 and 175° C. The cure temperature should be less than the reflow temperature of solder bump interconnections 32 to ensure that the solder bumps do not reflow during the curing step. The curing of the encapsulants, however, should be carried out at a temperature low enough to minimize thermally induced stresses in die 12. By way of an example of a preferred embodiment, the curing is done at about 150° C. for about 30 minutes.

Following curing, encapsulant 16 includes peripheral fillets 38 that extend about integrated circuit die 12 over substrate 14. Fillets 38 are adjacent to die perimeter 24 and assist in distributing the stresses and contribute to the strengthening and enhanced reliability of microelectronic assembly 10. In a preferred embodiment, polymeric reinforcement 18 has a thickness between about 1 mil and about 20 mils, preferably less than about 15 mils. The thickness of polymeric reinforcement 18 depends upon the amount of curable material 34 deposited, and the desired thickness is chosen to ensure desired thermal expansion characteristics of reinforcement 18.

The product microelectronic assembly 10 includes integrated circuit die 12 overlying substrate 14 and spaced apart from substrate 14 by gap 30. Integrated circuit die 12 includes a perimeter 24 and a face 27 that faces away from substrate 14. Solder bump interconnections 32 extend across gap 30 and connect integrated circuit die 12 to substrate 14. Encapsulant 16 is disposed within gap 30 about solder bump interconnections 32. Polymeric reinforcement 18 is disposed on face 27 of integrated circuit die 12 to protect integrated circuit die 12 and is spaced apart from perimeter 24. More particularly, polymeric reinforcement 18 is disposed on nonactive face 27 and overlies central region 20 and is spaced apart from perimeter 24 to prevent contact between reinforcement 18 and encapsulant 16, which contact, even if incidental, can dramatically affect the peripheral fillet geometry of encapsulant 16 and thereby drastically reduce the effectiveness of encapsulant 16. In general, it is desired to provide a spacing of at least 20 mils to assume adequate separation despite the jostling that occurs prior to and during curing. However, separation as little as 0.5 mils is effective to maintain desired fillet geometry.

By way of an example of the benefits obtained by this invention, integrated circuit die 12 is formed of silicon and has a coefficient of thermal expansion between about 2 and 3 ppm/°C. Substrate 14 is preferably composed of a polymer and has a coefficient of thermal expansion of between about 15 and 22 ppm/°C., higher than that of die 12. During the heating and cooling of preassembly 15, substrate 14 expands and contracts more than die 12. An underfilling encapsulant reduces the stresses on solder bump interconnections 32. However, stresses are induced on die 12, such as during the curing of the underfilling encapsulant and during thermal cycling, that are particularly detrimental to non-active face 27.

Polymeric reinforcement 18 reduces the effects of thermal stresses, which stresses might otherwise damage die 12 and interconnections 32 bonded thereto. Further, polymeric reinforcement 18, which has a coefficient of thermal expansion between about 15 and 22 ppm/°C., counteracts the forces that tend to warp, and eventually weaken, integrated circuit die 12. In addition, polymeric reinforcement 18 fills cracks and other defects on non-active face 27 to further strengthen die 12 and lead to increased reliability of assembly 10. Moreover, polymeric reinforcement 18 protects non-active face 27 from damage during subsequent use.

Thus, this invention provides a microelectronic assembly that comprises an integrated circuit die spaced apart from a substrate by a gap and mounted thereto by a plurality of solder bump interconnections. The gap is filled with an encapsulant. In prior art assemblies, the difference in thermal expansion between the die and the encapsulant could lead to warping and cracking of the non-active face of the die. In accordance with this invention, a polymeric reinforcement is disposed on the non-active face to provide increased protection for the die and enhanced mechanical strength for the microelectronic assembly. While not limited to a particular theory, the polymeric reinforcement is believed to assist in the redistribution of stresses along the active and non-active faces to reduce warping of the die during thermal cycling. Moreover, the polymeric reinforcement fills cracks and other defects on the non-active face to strengthen the die. The polymeric reinforcement also physically protects the non-active face of the integrated circuit die from damage during use. Further, in accordance with this invention, by limiting the polymeric reinforcement to the central region of the non-active face, the preferred peripheral fillet geometry that is formed in the encapsulant is retained, thereby increasing the reliability of the microelectronic assembly.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:
   a substrate;
   an integrated circuit die overlying the substrate and spaced apart therefrom by a gap, said integrated circuit die including a perimeter and a face facing away from the substrate;
   a plurality of solder bump interconnections bonded to the integrated circuit die, extending across the gap, and connecting the substrate to the integrated circuit die;
   an encapsulant disposed within the gap about the plurality of solder bump interconnections; and
   a polymeric reinforcement disposed on the face of the integrated circuit die and the polymeric reinforcement spaced apart from the perimeter.

2. A microelectronic assembly in accordance with claim 1, wherein the encapsulant comprises a peripheral fillet adjacent the die perimeter, and wherein the polymeric reinforcement is spaced apart from the peripheral fillet.

3. A microelectronic assembly in accordance with claim 1, wherein the encapsulant and the polymeric reinforcement are composed of a substantially similar polymeric composition.

4. A microelectronic assembly in accordance with claim 1, wherein the encapsulant and the polymeric reinforcement are composed of a material comprising inorganic particles and an epoxy-base resin.

5. A microelectronic assembly in accordance with claim 1, wherein the polymeric reinforcement has a coefficient of thermal expansion between about 15 and 22 ppm/°C.

6. A microelectronic assembly in accordance with claim 1, wherein the polymeric reinforcement is spaced apart from the perimeter by at least about 20 mils.

7. A microelectronic assembly comprising:
   a substrate including a plurality of substrate bond pads;
   an integrated circuit die overlying the substrate and spaced apart therefrom by a gap, said integrated circuit die comprising an active face facing the substrate, a non-active face opposite the active face, and a die perimeter, said active face comprising a plurality of die bond pads, said non-active face comprising a central region and a border region surrounding the central region;
   a plurality of solder bump interconnections that extend across the gap and connect the substrate bond pads to the die bond pads;
   a polymeric encapsulant disposed within the gap about the plurality of solder bump interconnections; and
   a polymeric reinforcement disposed on the non-active face overlying the central region and spaced apart from the perimeter by the border region.

8. A microelectronic assembly in accordance with claim 7, wherein the polymeric encapsulant forms a peripheral fillet that extends onto the die perimeter.

9. A microelectronic assembly in accordance with claim 7, wherein the polymeric encapsulant and the polymeric reinforcement are formed of a substantially similar composition comprising inorganic particulate filler and a polymer matrix.

10. A microelectronic assembly in accordance with claim 7, wherein the polymeric encapsulant and the polymeric reinforcement comprise a polymeric matrix composed of an epoxy-base resin.

11. A microelectronic assembly in accordance with claim 7, wherein the polymeric reinforcement has a coefficient of thermal expansion between about 15 and 22 ppm/°C.

12. A microelectronic assembly in accordance with claim 7, wherein the polymeric reinforcement is spaced apart from the perimeter by at least about 20 mils.

13. A method for forming a microelectronic assembly, said method comprising:

fabricating a preassembly comprising an integrated circuit die mounted onto a substrate such that a gap is formed therebetween and further comprising solder bump interconnections that extend across the gap, said integrated circuit die having a die perimeter and a face facing away from the substrate, said face comprising a central region spaced apart from the die perimeter;

filling the gap with a first curable material comprising a curable polymeric precursor;

dispensing a second curable material comprising a curable polymeric material onto the central region of the integrated circuit die; and curing the first curable material to form a polymeric encapsulant and the second curable material to form a polymeric reinforcement disposed on the central region and spaced apart from the die perimeter.

14. A method for forming a microelectronic assembly in accordance with claim 13, wherein the first curable material is composed of a mixture comprising an inorganic filler and a polymeric precursor.

15. A method for forming a microelectronic assembly in accordance with claim 14, wherein the polymeric precursor is an epoxy-base precursor.

16. A method for forming a microelectronic assembly in accordance with claim 13, wherein the second curable material is composed of a mixture comprising an inorganic filler and a polymeric precursor.

17. A method for forming a microelectronic assembly in accordance with claim 16, wherein the polymeric precursor is an epoxy-base precursor.

18. A method for forming a microelectronic assembly in accordance with claim 13, wherein the second curable material and the second curable material have substantially similar compositions.

19. A method for forming a microelectronic assembly in accordance with claim 13, wherein the step of dispensing comprises dispensing the second curable material in a rectangular pattern.

* * * * *

UNITED STATES PATENT AND TRADEMARK OFFICE
CERTIFICATE OF CORRECTION

PATENT NO. :
DATED      : 5,895,976
INVENTOR(S) : Apr. 20, 1999
Morrell et al.

It is certified that error appears in the above-identified patent and that said Letters Patent is hereby corrected as shown below:

Column 8, line 15 reads "wherein the second curable" should be --wherein the first curable--.

Signed and Sealed this

Twenty-first Day of December, 1999

Attest:

Q. TODD DICKINSON

Attesting Officer

Acting Commissioner of Patents and Trademarks